United States Patent
Liu et al.

(10) Patent No.: US 12,249,626 B2
(45) Date of Patent: Mar. 11, 2025

(54) ARSENIC DIFFUSION PROFILE ENGINEERING FOR TRANSISTORS

(71) Applicant: Applied Materials, Inc., Santa Clara, CA (US)

(72) Inventors: Patricia M. Liu, Saratoga, CA (US); Flora Fong-Song Chang, Saratoga, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

(21) Appl. No.: 17/628,634

(22) PCT Filed: Jul. 1, 2020

(86) PCT No.: PCT/US2020/040535
§ 371 (c)(1),
(2) Date: Jan. 20, 2022

(87) PCT Pub. No.: WO2021/021381
PCT Pub. Date: Feb. 4, 2021

(65) Prior Publication Data
US 2022/0320294 A1    Oct. 6, 2022

Related U.S. Application Data

(60) Provisional application No. 62/881,710, filed on Aug. 1, 2019.

(51) Int. Cl.
*H01L 21/00* (2006.01)
*H01L 21/02* (2006.01)
(Continued)

(52) U.S. Cl.
CPC ...... *H01L 29/167* (2013.01); *H01L 21/02463* (2013.01); *H01L 21/2205* (2013.01); *H01L 29/66803* (2013.01); *H01L 29/785* (2013.01)

(58) Field of Classification Search
CPC ............ H01L 29/167; H01L 21/02463; H01L 21/2205; H01L 29/66803; H01L 29/785
See application file for complete search history.

(56) References Cited

U.S. PATENT DOCUMENTS 10,840,358 B2 * 11/2020 More .................. H01L 29/0847
2007/0215956 A1    9/2007 Tsuchiya et al.
(Continued)

FOREIGN PATENT DOCUMENTS

JP     2000-223675 A    8/2000
JP     2006310772 A     11/2006
(Continued)

OTHER PUBLICATIONS

Japanese Office Action, dated Feb. 28, 2023, for Application No. 2022-505425.
(Continued)

*Primary Examiner* — Richard A Booth
(74) *Attorney, Agent, or Firm* — Patterson + Sheridan, LLP (57) ABSTRACT

Embodiments of the present disclosure relate to methods for forming a source/drain extension. In one embodiment, a method for forming an nMOS device includes forming a gate electrode and a gate spacer over a first portion of a semiconductor fin, removing a second portion of the semiconductor fin to expose a side wall and a bottom, forming a silicon arsenide (Si:As) layer on the side wall and the bottom, and forming a source/drain region on the Si:As layer. During the deposition of the Si:As layer and the formation of the source/drain region, the arsenic dopant diffuses from the Si:As layer into a third portion of the semiconductor fin located below the gate spacer, and the third portion becomes a doped source/drain extension region. By utilizing the Si:As layer, the doping of the source/drain extension region is controlled, leading to
(Continued)

reduced contact resistance while reducing dopants diffusing into the channel region.

20 Claims, 8 Drawing Sheets

(51) Int. Cl.
*H01L 21/22* (2006.01)
*H01L 29/167* (2006.01)
*H01L 29/66* (2006.01)
*H01L 29/78* (2006.01)

(56) References Cited

U.S. PATENT DOCUMENTS

| | | | |
|---|---|---|---|
| 2013/0234203 A1 | 9/2013 | Tsai et al. | |
| 2013/0256664 A1* | 10/2013 | Qin | H01L 29/66636 257/E29.062 |
| 2017/0330960 A1 | 11/2017 | Bauer et al. | |
| 2019/0165100 A1 | 5/2019 | Kuo et al. | |

FOREIGN PATENT DOCUMENTS

| | | | |
|---|---|---|---|
| JP | 2007067425 | A | 3/2007 |
| JP | 2008311678 | A | 12/2008 |
| JP | 2013511159 | A | 9/2013 |
| JP | 2018006694 | A | 1/2018 |
| KR | 10-2013-0103265 | A | 9/2013 |
| KR | 10-2018-0134428 | A | 12/2018 |
| TW | 200403847 | A | 3/2004 |
| TW | 201923853 | A | 6/2019 |
| WO | 2013161768 | A | 10/2013 |

OTHER PUBLICATIONS

International Search Report and Written Opinion dated Oct. 27, 2020 for Application No. PCT/US2020/040535.
Korean Office Action dated Jun. 11, 2024 for Application No. 10-2022-7006635.
Taiwan Office Action for Application No. 109123685 dated Mar. 25, 2024.
Japanese Office Action dated Jul. 30, 2024 for Application No. 2023-132803.
Taiwan Office Action for Application No. 109123685 dated Oct. 23, 2024.

* cited by examiner

ARSENIC DIFFUSION PROFILE ENGINEERING FOR TRANSISTORS

BACKGROUND

Field

Embodiments of the present disclosure generally relate to methods for forming a transistor, and more particularly relate to methods for forming a source/drain extension.

Description of the Related Art

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, FinFETs are still associated with some drawbacks.

For example, in n-channel metal-oxide semiconductor (nMOS) devices, strong diffusion of phosphorous atoms from heavily phosphorus doped silicon (Si:P) regions into the channel is a concern in smaller FinFETs. Thus, while higher concentrations of phosphorous atoms allows very low contact resistance and can beneficially reduce resistivity in the source and drain regions of a FinFET, the risk of phosphorus atoms diffusion from a source/drain extension into the channel is greatly increased, particularly for FinFETs having smaller dimensions.

Therefore, there is a need for an improved method to form a transistor.

SUMMARY

Embodiments of the present disclosure generally relate to methods for forming a transistor, and more particularly relate to methods for forming a source/drain extension. In one embodiment, a transistor includes a gate electrode structure disposed over a channel region, a source/drain extension region doped with arsenic disposed adjacent to the channel region, an arsenic doped silicon layer disposed on the source/drain extension region, and a source/drain region disposed on the arsenic doped silicon layer.

In another embodiment, a method for forming a transistor includes removing a first portion of a semiconductor fin to expose a side wall and a bottom, and a second portion of the semiconductor fin is disposed below a gate electrode structure. The method further includes forming an arsenic doped silicon layer on the side wall and the bottom by a selective epitaxial deposition process, and forming a source/drain region on the arsenic doped silicon layer while doping the second portion of the semiconductor fin with arsenic.

In another embodiment, a non-transitory computer readable storage medium having stored thereon a plurality of instructions, the plurality of instructions including instructions to control components of a processing system to perform the process of removing a first portion of a semiconductor fin to expose a side wall and a bottom, and a second portion of the semiconductor fin is disposed below a gate electrode structure. The process further includes forming an arsenic doped silicon layer on the side wall and the bottom by a selective epitaxial deposition process, and forming a source/drain region on the arsenic doped silicon layer while doping the second portion of the semiconductor fin with arsenic.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to methods for forming a source/drain extension. In one embodiment, a method for forming an nMOS device includes forming a gate electrode and a gate spacer over a first portion of a semiconductor fin, removing a second portion of the semiconductor fin to expose a side wall and a bottom, forming an arsenic doped silicon (Si:As) layer on the side wall and the bottom, and forming a source/drain region on the Si:As layer. During the deposition of the Si:As layer and the formation of the source/drain region, the arsenic dopant diffuses from the Si:As layer into a third portion of the semiconductor fin located below the gate spacer, and the third portion becomes a doped source/drain extension region. By utilizing the Si:As layer, the doping of the source/drain extension region is controlled, leading to reduced contact resistance while reducing dopants diffusing into the channel region.

Figure 1:
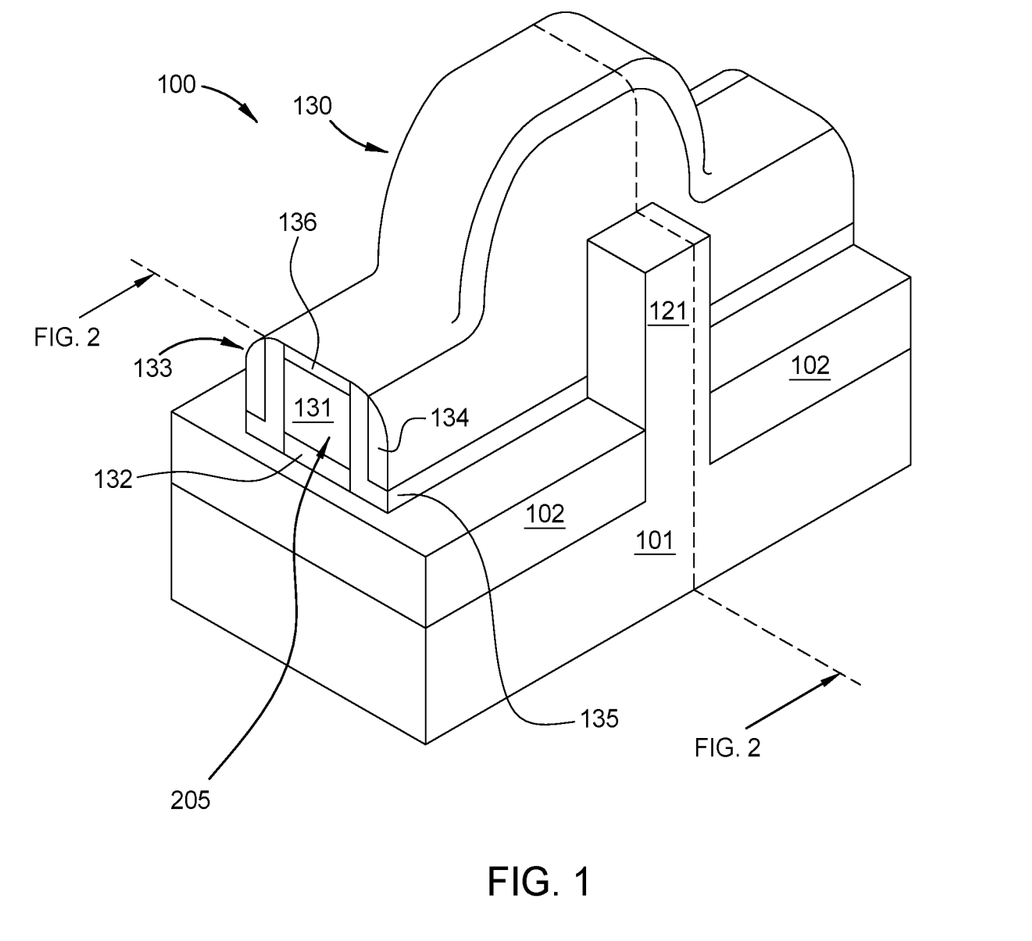
FIG. 1 is a schematic perspective view of a FinFET, according to an embodiment of the disclosure.

FIG. 1 is a schematic perspective view of a FinFET 100, according to an embodiment of the disclosure. The FinFET 100 includes a semiconductor substrate 101, insulation regions 102 disposed on the semiconductor substrate 101, a semiconductor fin 121 extending from the semiconductor substrate 101, and a gate electrode structure 130 disposed on the insulation regions 102 and the semiconductor fin 121. A top portion of the semiconductor fin 121 is exposed and electrically coupled to a source contact (not shown) of the FinFET 100, another top portion of semiconductor fin 121 is exposed and electrically coupled to a drain contact (not shown) of the FinFET 100, and a center portion of the semiconductor fin 121 includes the channel region of the FinFET 100. The gate electrode structure 130 serves as the gate of the FinFET 100.

The semiconductor substrate 101 may be a bulk silicon (Si) substrate, a bulk germanium (Ge) substrate, a bulk silicon-germanium (SiGe) substrate, or the like. The insulation regions 102, alternatively referred to as shallow trench isolation (STI), may include one or more dielectric materials, such as silicon dioxide ($SiO_2$), silicon nitride ($Si_3N_4$), or multiple layers thereof. The insulation regions 102 may be formed by high-density plasma (HDP), flowable chemical vapor deposition (FCVD), or the like.

A fin spacer (not shown for clarity) may be disposed on sidewalls of the semiconductor fin 121. The semiconductor fin 121 may be formed from the semiconductor substrate 101 or from a different semiconductor material that is deposited on the semiconductor substrate 101. In the latter case, the different semiconductor material may include silicon-germanium, a III-V compound semiconductor material, or the like.

The gate electrode structure 130 includes a gate electrode layer 131, a gate dielectric layer 132, the gate spacers 133, and a mask layer 136. In some embodiments, the gate electrode layer 131 includes a polysilicon layer or a metal layer that is capped with a polysilicon layer. In other embodiments, the gate electrode layer 131 includes a material selected from metal nitrides (such as titanium nitride (TiN), tantalum nitride (TaN) and molybdenum nitride (MoNx)), metal carbides (such as tantalum carbide (TaC) and hafnium carbide (HfC)), metal-nitride-carbides (such as TaCN), metal oxides (such as molybdenum oxide (MoOx)), metal oxynitrides (such as molybdenum oxynitride (MoOxNy)), metal silicides (such as nickel silicide), and combinations thereof. The gate electrode layer 131 can also be a metal layer capped with a polysilicon layer.

The gate dielectric layer 132 may include silicon oxide (SiOx), which may be formed by a thermal oxidation of the semiconductor fin 121. In other embodiments, the gate dielectric layer 132 is formed by a deposition process. Suitable materials for forming the gate dielectric layer 132 include silicon oxide, silicon nitrides, oxynitrides, metal oxides such as HfO2, HfZrOx, HfSiOx, HfTiOx, HfAlOx, and combinations and multi-layers thereof. The gate spacers 133 are formed on sidewalls of the gate electrode layer 131, and each gate spacer 133 includes a nitride portion 134 and/or an oxide portion 135 as shown. In some embodiments, the mask layer 136 is formed on gate electrode layer 131 as shown, and may include silicon nitride.

Figure 2:
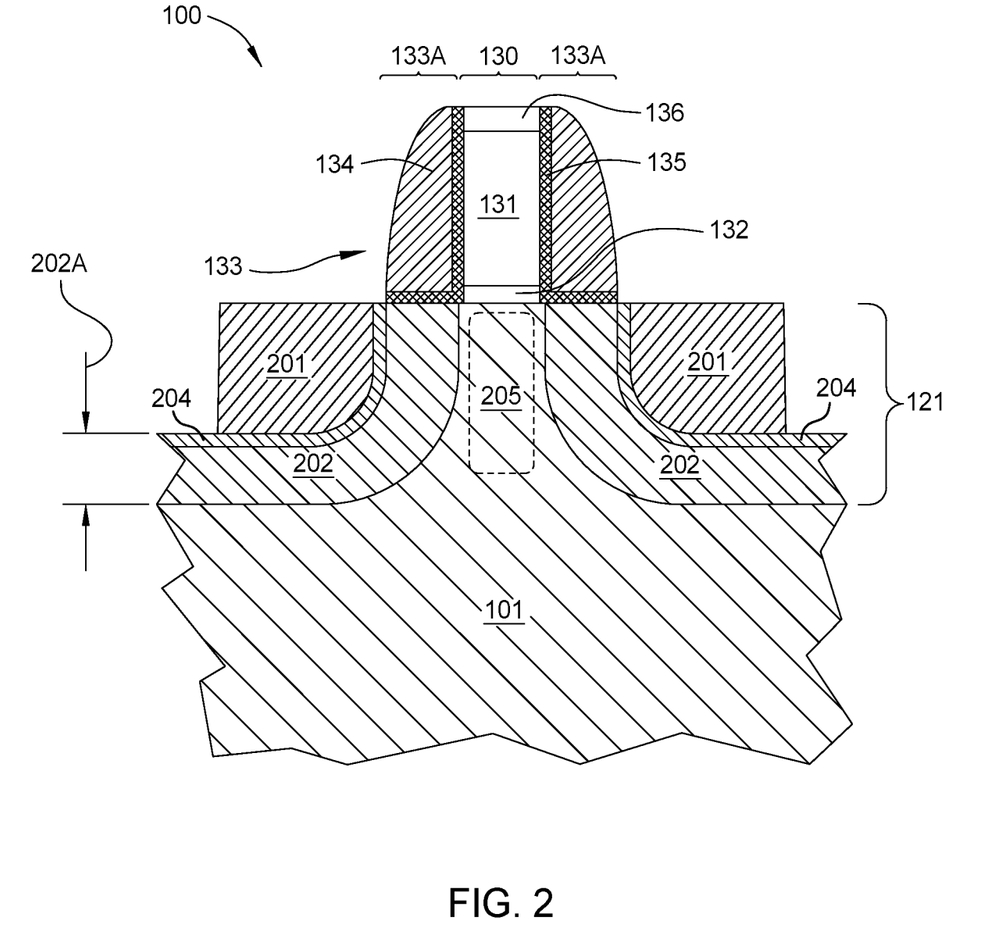
FIG. 2 is a schematic cross-sectional view of the FinFET of FIG. 1, according to an embodiment of the disclosure.

FIG. 2 is a schematic cross-sectional view of FinFET 100, according to an embodiment of the disclosure. The cross-sectional view illustrated in FIG. 2 is taken at section A-A in FIG. 1. As shown in FIG. 2, the FinFET 100 includes the semiconductor fin 121 with source and drain regions 201, Si:As layers 204, source and drain extension regions 202, and a channel region 205.

The source and drain regions 201 include relatively high concentrations of dopants, such as n-type dopants, for example phosphorus (P) or arsenic (As). For example, in some embodiments, a concentration of n-type dopants in the source and drain regions 201 may be as high as 5E21 atoms/$cm^3$. The source and drain regions 201 may be produced by any suitable method. In one embodiment, the source and drain regions 201 are formed by an in-situ doping of a semiconductor layer using an epitaxial deposition process. In another embodiment, the source and drain regions are formed by first depositing a semiconductor layer and then doping the deposited semiconductor layer.

Each source/drain region 201 is disposed on the Si:As layer 204. The Si:As layer 204 has a thickness ranging from about 1 nm to about 10 nm. The Si:As layer 204 may be deposited by any suitable method, such as an epitaxial deposition process. The source and drain extension regions 202 is doped with As. In some embodiments, source and drain extension regions 202 are formed with a thickness 202A that is substantially the same as the width 133A of gate spacers 133.

With the small geometries associated with modern FinFET devices, a width 133A of gate spacers 133, which is also approximately the distance between the channel region 205 and the source/drain region 201, can be just a few nanometers. Conventionally, the undoped source and drain extension regions are first removed, and doped source and drain extension regions are formed on both sides of the channel region. Dopant can diffuse into the channel region during the formation of the doped source and drain extension regions. Alternatively, doping the undoped source and drain extension regions by any doping method can also lead to diffusion of dopant into the channel region.

In order to form the doped source and drain extension regions 202 without the risk of dopant diffusion into the channel region 205, the Si:As layers 204 are utilized. During the deposition of the Si:As layers 204 and the deposition of the source and drain regions 201, As atoms diffuse into the source and drain extension regions 202 from the Si:As layers 204. The diffusion of the As atoms from the Si:As layers 204 can be controlled by controlling the amount of excessive point defects in the Si:As layers 204. By depositing the Si:As layers 204 at a lower temperature, such as from about 500 degrees Celsius to about 700 degrees Celsius, and a high deposition rate, such as about 50 Angstroms per minute to about 500 Angstroms per minute, the Si:As layers 204 as deposited are point defect rich. During the deposition of the source and drain regions 201, the deposition temperature, such as from about 500 degrees Celsius to about 700 degrees Celsius, increases As atoms diffusion into the source and drain extension regions 202 due to the point defect flux in the Si:As layers 204. Near the end of the deposition of the source and drain regions 201, the excessive point defects in the Si:As layers 204 move to the interface between the Si:As layer 204 and the source/drain extension region 202, which stops the diffusion of the As atoms from the Si:As layers 204 to the source/drain extension region 202. Therefore, the amount of excessive point defects in the Si:As layers 204 controls the As atoms diffusion depth. In other words, during the deposition of the source and drain regions 201, the excessive point defects are depleted in the Si:As layers 204, the source and drain regions 201 and the exposed surfaces to the chamber environment, which stops the As atoms from further diffusing from the Si:As layers 204 to the source and drain extension layers 202. In some embodiments, the diffusion of As atoms from the Si:As layers 204 to the source and drain extension layers 202 can be control by performing a thermal treatment process on the Si:As layers 204 prior to depositing the source and drain regions 201. The thermal treatment process may be a spike anneal process.

Figure 3:
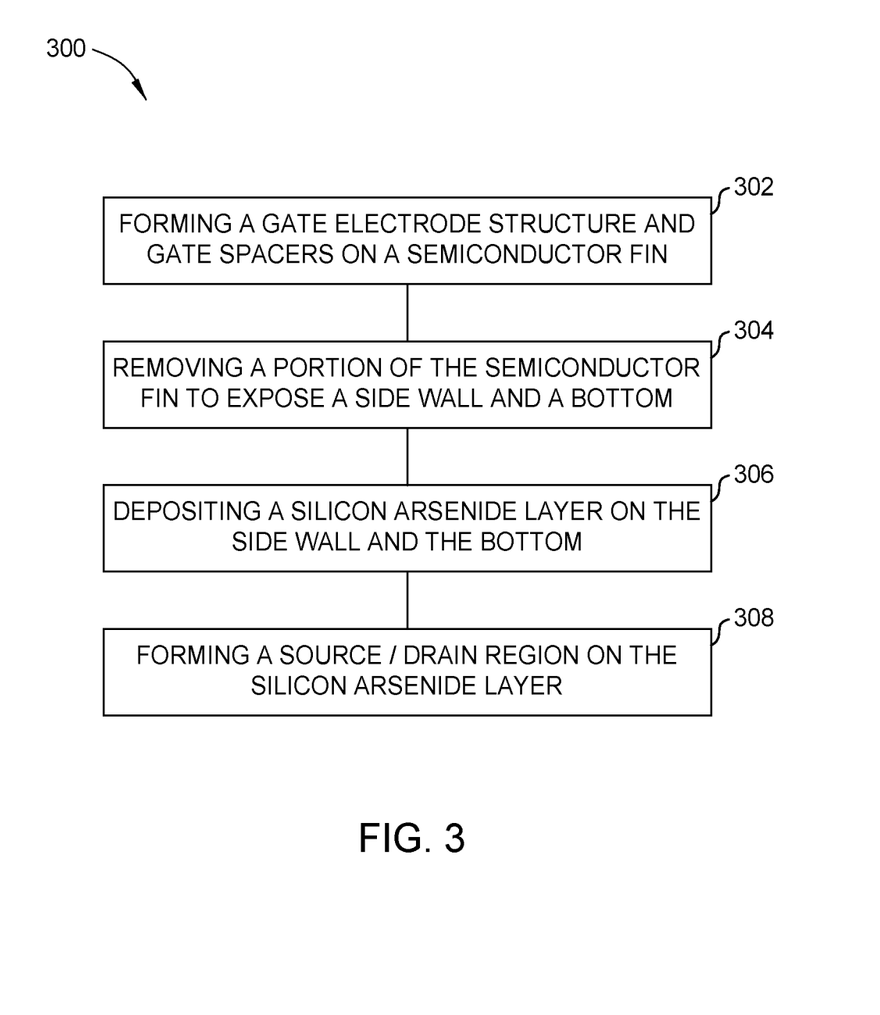
FIG. 3 is a flowchart of a process for forming a FinFET of FIG. 1, according to an embodiment of the disclosure.
Figure 4A:
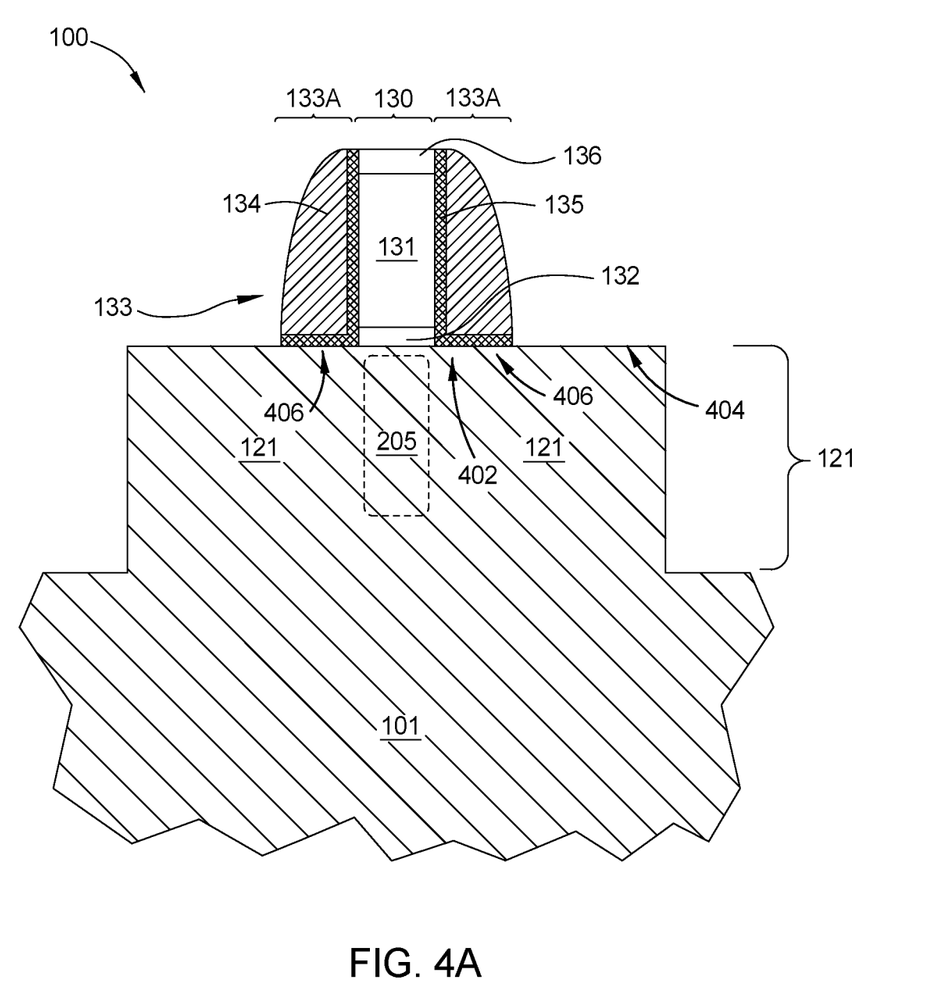
FIGS. 4A-4D are schematic cross-sectional views of a semiconductor device corresponding to various stages of the process of FIG. 3, according to an embodiment of the disclosure.

FIG. 3 is a flowchart of a process 300 for forming an nMOS FinFET, according to an embodiment of the disclosure. FIGS. 4A-4D are schematic cross-sectional views of a semiconductor device corresponding to various stages of the process 300 according to an embodiment of the disclosure. Although the process 300 is illustrated for forming an n-type doped source/drain extension region, the process 300 may be employed to form other structures on a substrate as well. The process 300 starts at operation 302, in which the gate electrode structure 130 and the gate spacers 133 are formed on the semiconductor fin 121, as shown in FIG. 4A. The gate electrode structure 130 and the gate spacers 133 are disposed on a first portion 402 of the semiconductor fin 121, and a second portion 404 of the semiconductor fin is exposed. The first portion 402 of the semiconductor fin 121 includes the channel region 205 disposed below the gate electrode structure 130 and a third portion 406 disposed below the gate spacers 133.

Figure 4B:
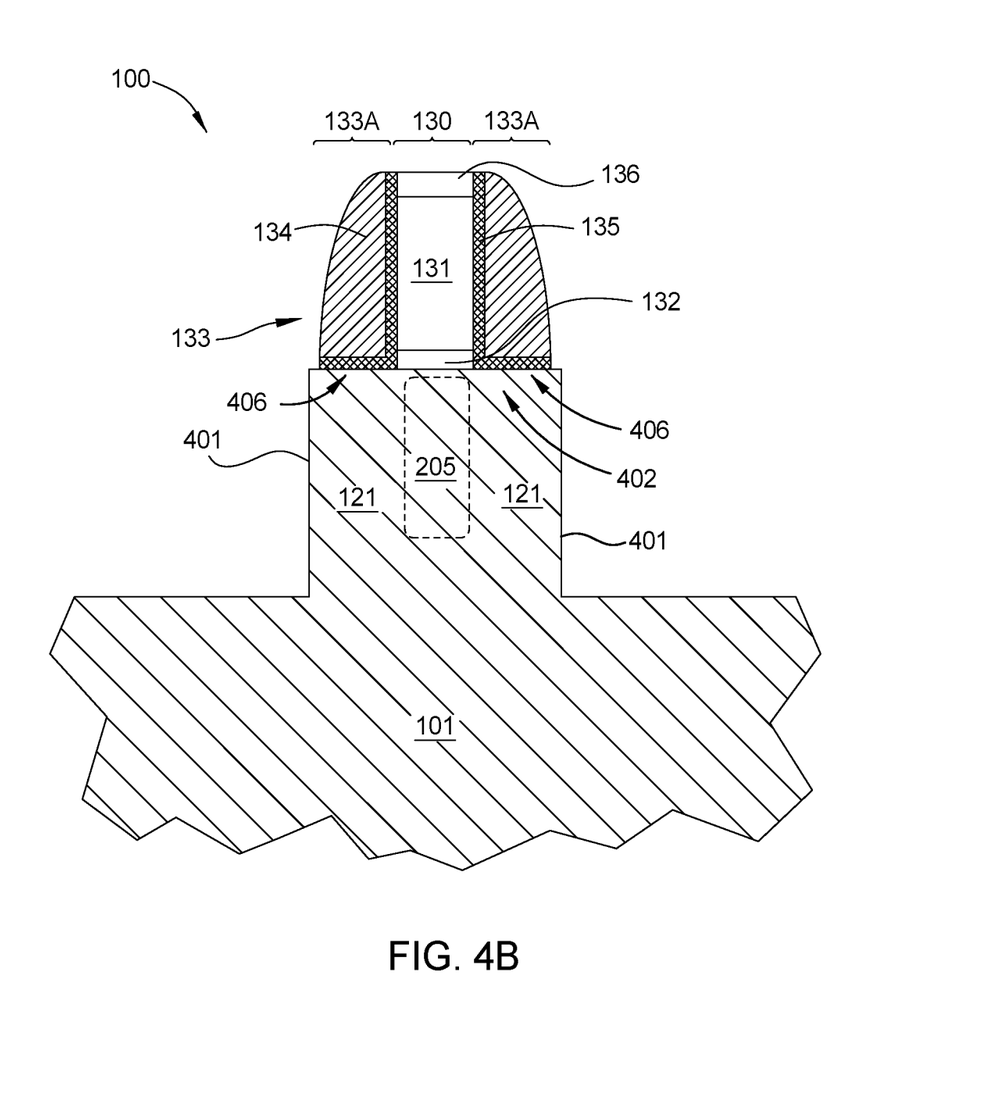

At operation 304, an etch process is performed to remove the second portion 404 of the semiconductor fin 121, as shown in FIG. 4B. The etch process may be an anisotropic etch process. The anisotropic etch process may be, for example, a deep reactive-ion etch (DRIE) process during which gate electrode structure 130 and gate spacers 133 are masked. The etch process exposes side walls 401 of the third portion 406 of the semiconductor fin and bottoms 403. The bottoms 403 may be a surface of the semiconductor substrate 101.

Figure 4C:
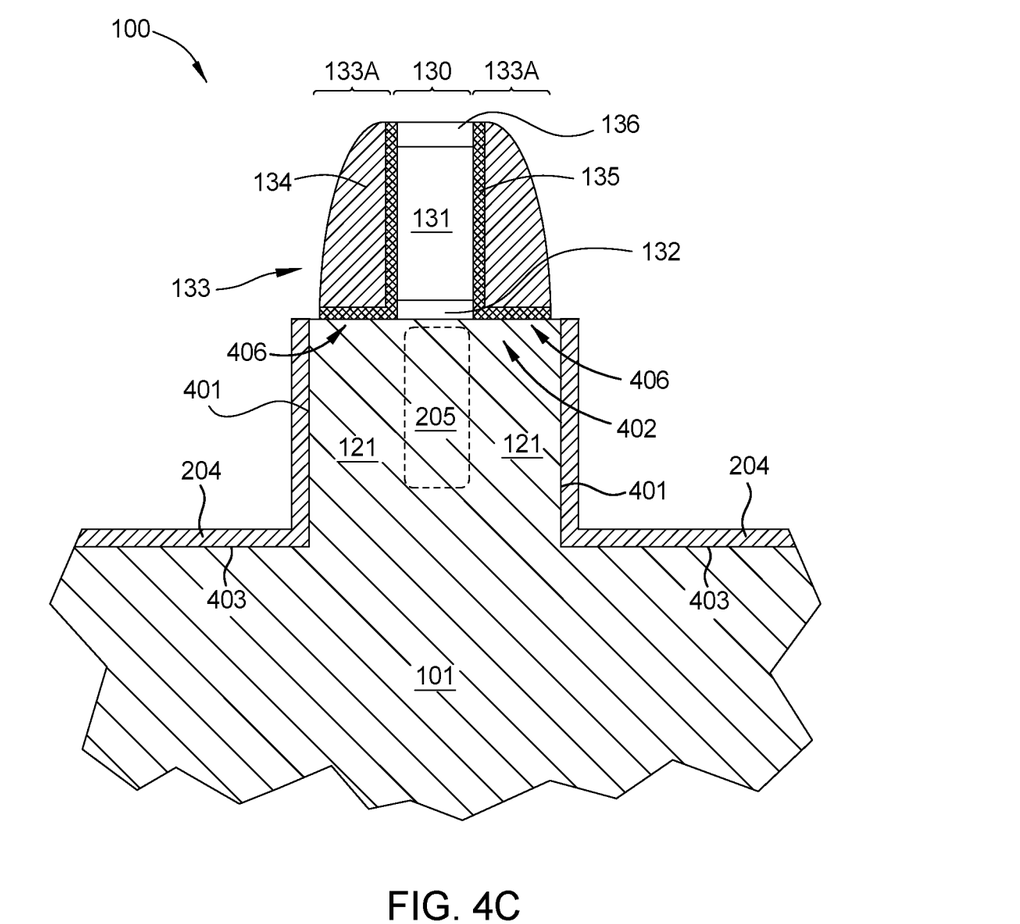

At operation 306, the Si:As layer 204 is deposited on the side wall 401 and the bottom 403, as shown in FIG. 4C. The Si:As layer 204 may have a thickness ranging from about 1 nm to about 10 nm. The Si:As layer 204 may be deposited by an epitaxial deposition process, such as a selective epitaxial deposition process. For example, the Si:As layer 204 is deposited on the side wall 401 and the bottom 403, which are fabricated from a semiconductor material, such as Si, and the Si:As layer 204 is not deposited on the gate spacers 133 and the mask layer 136, which are fabricated from a dielectric material. The deposition process may be performed at a chamber pressure ranging from about 1 Torr to about 600 Torr, such as from about 10 Torr to about 20 Torr, and at a deposition temperature (temperature of the substrate) ranging from about 500 degrees Celsius to about 700 degrees Celsius, such as from about 600 degrees Celsius to about 625 degrees Celsius. A silicon containing precursor and an arsenic containing precursor are flowed into the process chamber. The silicon containing precursor may be silane, disilane, dichlorosilane (DCS), trichlorosilane (TCS), or any suitable silicon containing precursor. The silicon containing precursor may include two or more silicon containing gases. The silicon containing precursor may have a flow rate ranging from about 1 sccm to about 1000 sccm, such as 1 sccm to about 500 sccm, or 10 sccm to about 1000 sccm. The arsenic containing precursor may be arsine, tertiarybutylarsine (TBA), or any suitable arsenic containing precursor. The arsenic containing precursor may include two or more arsenic containing gases. The arsenic containing precursor may have a flow rate ranging from about 0.1 sccm to about 100 sccm. In some embodiments, a carrier gas, such as nitrogen gas or hydrogen gas, may be flowed with the silicon containing precursor and the arsenic containing precursor. In some embodiments, an etchant may be flowed with the silicon containing precursor and the arsenic containing precursor in order to perform selective etch back to improve selectivity of the Si:As deposition. An example of the etchant is hydrochloric acid.

The amount of excessive point defects in the Si:As layer 204 may be controlled by varying processing conditions, such as partial pressure of the precursors, ratio of the precursors, processing temperature, and/or layer thickness. The amount of excessive point defects in the Si:As layer 204 can control the As atoms diffusion into the third portions 406 of the semiconductor fin 121. During the deposition of the Si:As layer 204, As atoms are diffused into the third portion 406 of the semiconductor fin 121.

Figure 4D:
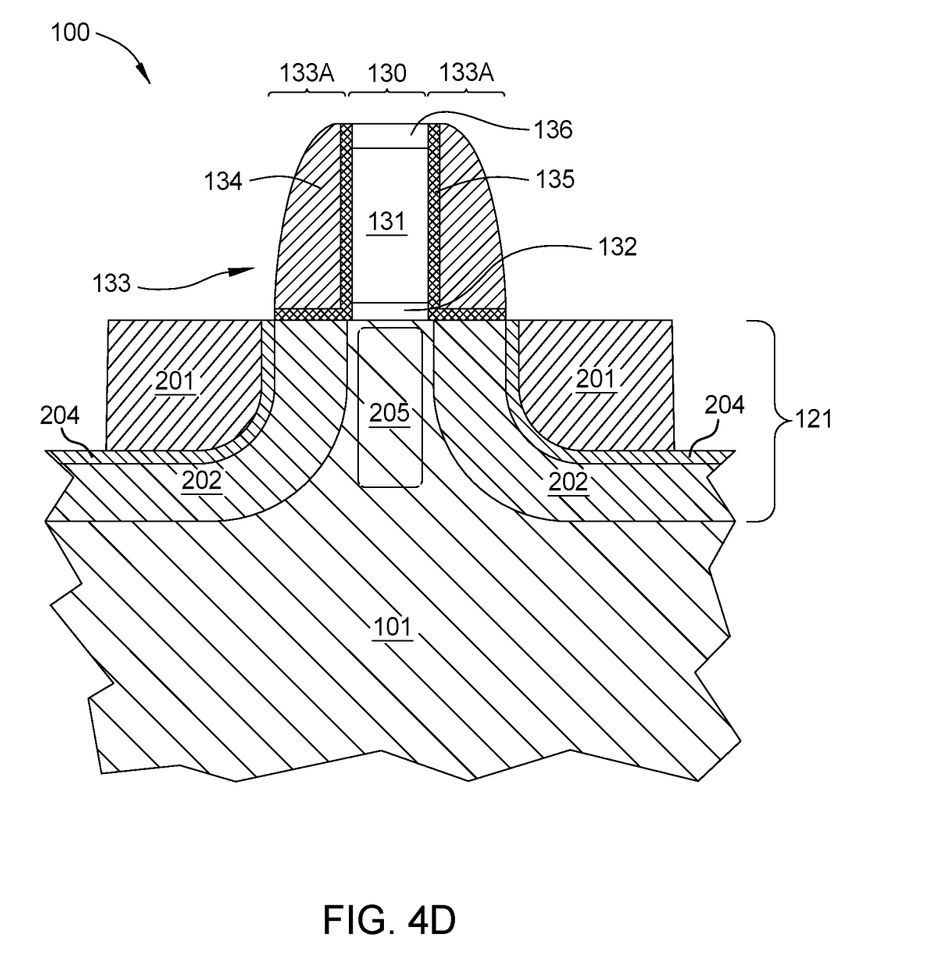

At operation 308, the source and drain regions 201 are formed on the Si:As layer 204, as shown in FIG. 4D. The source and drain regions 201 may be a doped semiconductor material, such as phosphorous doped silicon. The source and drain regions 201 may be formed by any suitable method, such as epitaxial deposition process. During the deposition of the source and drain regions 201, As atoms in the Si:As layer 204 continue to diffuse into the third portion 406 of the semiconductor fin 121, and the doped third portions 406 of the semiconductor fin 121 become the source and drain extension regions 202, as shown in FIG. 4D. The source and drain extension regions 202 have a smaller dopant concentration compared to the source and drain regions 201. For example, each source/drain extension region 202 has a dopant concentration of ranging from about 1E17 atoms/cm$^3$ to about 2E20 atoms/cm$^3$. The dopant in the source and drain regions 201 may be the same as or different from the dopant in the source and drain extension regions 202. In one embodiment, the dopant in the source and drain regions 201 is phosphorous and the dopant in the source and drain extension regions 202 is arsenic.

Figure 5:
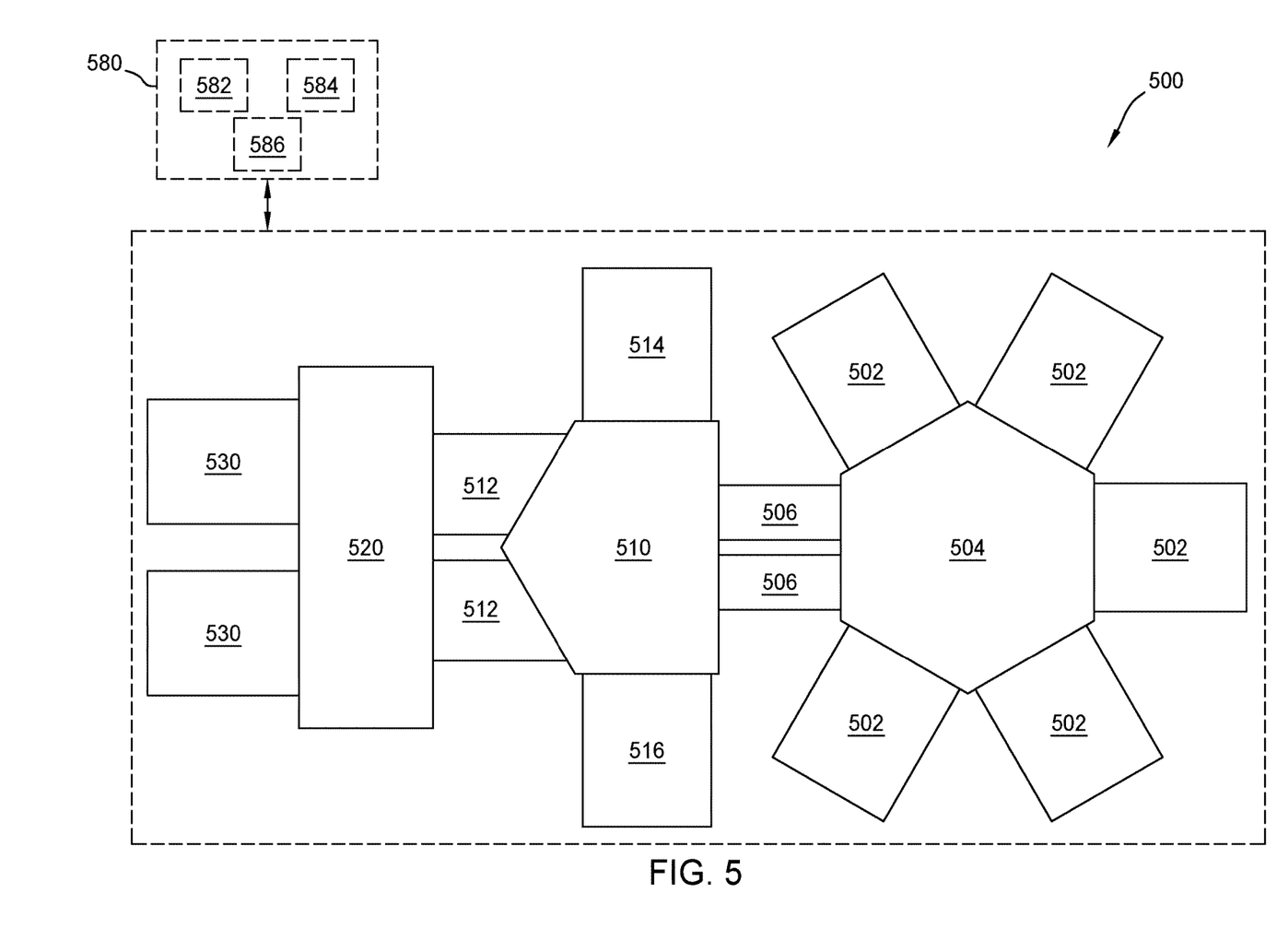
FIG. 5 is a schematic top-view diagram of an example multi-chamber processing system suitable for performing the process of FIG. 3.

Examples of a processing system that may be suitably modified in accordance with the teachings provided herein include the ENDURA®, PRODUCER® or CENTURA® integrated processing systems or other suitable processing systems commercially available from Applied Materials, Inc., located in Santa Clara, California. It is contemplated that other processing systems (including those from other manufacturers) may be adapted to benefit from aspects described herein. FIG. 5 illustrates a schematic top-view diagram of an example multi-chamber processing system 500 that can be used to complete the method 300 illustrated in FIG. 3, according to embodiments of the present disclosure. As shown in FIG. 5, a plurality of process chambers 502 is coupled to a first transfer chamber 504. The first transfer chamber 504 is also coupled to a first pair of pass-through chambers 506. The first transfer chamber 504 has a centrally disposed transfer robot (not shown) for transferring substrates between the pass-through chambers 506 and the process chambers 502. The pass-through chambers 506 are coupled to a second transfer chamber 510, which is coupled to a process chamber 514 and a process chamber 516. The second transfer chamber 510 has a centrally disposed transfer robot (not shown) for transferring substrates between a set of load lock chamber 512 and the process chamber 514 or the process chamber 516. A factory interface 520 is connected to the second transfer chamber 510 by the load lock chambers 512. The factory interface 520 is coupled to one or more pods 530 on the opposite side of the load lock chambers 512. The pods 530 typically are front opening unified pods (FOUP) that are accessible from a clean room.

During operation, a substrate is first transferred to the process chamber 514, in which operation 302 may be performed. The substrate is then transferred to the process chamber 516, in which operation 304 is performed. Next, the substrate is transferred to the one or more process chambers 502 in which operations 306 and 308 may be performed. Because all of the operations 302, 304, 306, and 308 are performed within the same processing system 500, vacuum is not broken as the substrate is transferred to various chambers, which decreases the chance of contamination and improves the quality of the deposited epitaxial film.

In some embodiments, operation 304 is performed in an etch chamber that is not a part of the processing system 500.

A system controller 580 is coupled to the processing system 500 for controlling the processing system 500 or components thereof. For example, the system controller 580 may control the operations of the processing system 500 using a direct control of the chambers 502, 504, 506, 510, 512, 514, 516 of the processing system 500 or by controlling controllers associated with the chambers 502, 504, 506, 510, 512, 514, 516. In operation, the system controller 580 enables data collection and feedback from the respective chambers to coordinate performance of the processing system 500.

The system controller 580 generally includes a central processing unit (CPU) 582, memory 584, and support circuits 586. The CPU 582 may be one of any form of a general purpose processor that can be used in an industrial setting. The memory 584, non-transitory computer-readable medium, or machine-readable storage device, is accessible by the CPU 582 and may be one or more of memory such as random access memory (RAM), read only memory (ROM), floppy disk, hard disk, or any other form of digital storage, local or remote. The support circuits 586 are coupled to the CPU 582 and may comprise cache, clock circuits, input/output subsystems, power supplies, and the like. The system controller 580 is configured to perform method 300 stored in the memory 584. The various embodiments disclosed in this disclosure may generally be implemented under the control of the CPU 582 by executing computer instruction code stored in the memory 584 (or in memory of a particular process chamber) as, e.g., a computer program product or software routine. That is, the computer program product is tangibly embodied on the memory 584 (or non-transitory computer-readable medium or machine-readable storage device). When the computer instruction code is executed by the CPU 582, the CPU 582 controls the chambers to perform operations in accordance with the various embodiments.

By utilizing Si:As layers between the source and drain regions and source and drain extension regions, doping of the source and drain extension regions is controlled. As a result, the As atoms do not diffuse into the channel region. Furthermore, processes, such as source and drain extension recess and source and drain extension regrowth, are omitted.

While the foregoing is directed to embodiments of the present disclosure, other and further embodiments of the disclosure may be devised without departing from the basic scope thereof, and the scope thereof is determined by the claims that follow.

What is claimed is:

1. A transistor, comprising:
a gate electrode structure disposed over a channel region;
a source/drain extension region doped with arsenic disposed adjacent to the channel region;
an epitaxial arsenic doped silicon layer disposed on the source/drain extension region; and
an epitaxial source/drain region disposed on the epitaxial arsenic doped silicon layer, the arsenic doped silicon layer disposed between the source/drain region and the source/drain extension region.

2. The transistor of claim 1, wherein the gate electrode structure comprises a gate electrode layer, a gate dielectric layer, and gate spacers.

3. The transistor of claim 2, wherein the gate spacers are disposed over the source/drain extension region.

4. The transistor of claim 3, wherein the source/drain extension region comprises a first doped semiconductor material having a first dopant concentration.

5. The transistor of claim 4, wherein the source/drain region comprises a second doped semiconductor material having a second dopant concentration greater than the first dopant concentration.

6. The transistor of claim 5, wherein a dopant in the first doped semiconductor material is the same as a dopant in the second doped semiconductor material.

7. The transistor of claim 5, wherein a dopant in the first doped semiconductor material is different from a dopant in the second doped semiconductor material.

8. A method for forming a transistor, comprising:
in a substrate, having a first portion co-planer with a second portion, removing the first portion of the substrate to expose a side wall and a bottom, the second portion of the substrate being disposed below a gate electrode structure of a semiconductor fin, the side wall disposed outward of a spacer of the semiconductor fin;
forming, by epitaxial deposition, an arsenic doped silicon layer on the side wall and the bottom by an epitaxial deposition process; and
forming, by epitaxial deposition, a source/drain region on the arsenic doped silicon layer while doping the second portion of the substrate with arsenic.

9. The method of claim 8, wherein the removing the first portion of the semiconductor fin is performed by an anisotropic etch process.

10. The method of claim 8, wherein a chamber pressure during the epitaxial deposition process ranges from about 1 Torr to about 600 Torr.

11. The method of claim 10, wherein a deposition temperature during the epitaxial deposition process ranges from about 500 degrees Celsius to about 700 degrees Celsius.

12. The method of claim 11, further comprising flowing a silicon containing precursor and an arsenic containing precursor into a process chamber during the epitaxial deposition process.

13. The method of claim 12, further comprising flowing an etchant into the process chamber during the epitaxial deposition process to achieve a selective epitaxial deposition process.

14. The method of claim 8, further comprising doping the second portion of the semiconductor fin during the forming the arsenic doped silicon layer and/or during the forming of the source/drain region.

15. The method of claim 14, wherein the second portion has a dopant concentration ranging from about 1E17 atoms/cm$^3$ to about 2E20 atoms/cm$^3$.

16. A non-transitory computer readable storage medium having stored thereon a plurality of instructions, the plurality of instructions including instructions to control components of a processing system to perform the process of:
in a substrate, having a first portion co-planer with a second portion, removing the first portion of the substrate to expose a side wall and a bottom, the second portion of the substrate being disposed below a gate electrode structure of a semiconductor fin, the side wall disposed outward of a spacer of the semiconductor fin;
forming, by epitaxial deposition, an arsenic doped silicon layer on the side wall and the bottom by an epitaxial deposition process; and
forming, by epitaxial deposition, a source/drain region on the arsenic doped silicon layer while doping the second portion of the semiconductor fin with arsenic.

17. The non-transitory computer readable storage medium of claim 16, wherein the removing the first portion of the semiconductor fin is performed by an anisotropic etch process.

18. The non-transitory computer readable storage medium of claim 16, wherein a chamber pressure during the epitaxial deposition process ranges from about 1 Torr to about 600 Torr.

19. The non-transitory computer readable storage medium of claim 18, wherein a deposition temperature during the epitaxial deposition process ranges from about 500 degrees Celsius to about 700 degrees Celsius.

20. The non-transitory computer readable storage medium of claim 19, further comprising doping the second portion of the semiconductor fin during the forming the arsenic doped silicon layer and/or during the forming of the source/drain region.

\* \* \* \* \*